Jan. 10, 1950 R. M. PAGE ET AL 2,493,775

RING-MOUNTED OSCILLATOR

Filed Aug. 25, 1942 2 Sheets-Sheet 1

Inventors

Robert M. Page
Merril F. Distad
Lamont V. Blake

By [signature]

Attorney

Jan. 10, 1950 R. M. PAGE ET AL 2,493,775

RING-MOUNTED OSCILLATOR

Filed Aug. 25, 1942 2 Sheets-Sheet 2

Inventors
Robert M. Page
Merril F. Distad
Lamont V. Blake

By [signature]
Attorney

Patented Jan. 10, 1950 2,493,775

UNITED STATES PATENT OFFICE 2,493,775

RING-MOUNTED OSCILLATOR

Robert M. Page, Washington, D. C., Merril F. Distad, Cheverly, Md., and Lamont V. Blake, Washington, D. C.

Application August 25, 1942, Serial No. 456,045

14 Claims. (Cl. 250—36)

(Granted under the act of March 3, 1883, as amended April 30, 1928; 370 O. G. 757)

This invention relates to a multi-tube oscillator capable of efficiently generating pulses of radio frequency energy at high power output levels and at high voltages over a wide range of frequencies.

In the use of radio echo distance finding and obstacle detecting equipment, it is desirable that the pulse oscillator be capable of operation over a wide band of frequencies without loss of efficiency and that some means be provided which will enable an operator to instantaneously vary the tuning over this range. These features are desirable not only to enable the oscillator to be readily tuned to the remaining units of the equipment, but, since, such equipment finds wide application to military uses, it is very important that the oscillator be capable of being quickly tuned out of the range of deliberately or accidentally interfering radio equipment.

It is further necessary that such an oscillator be capable of high peak power outputs since only a very minute portion of the transmitted pulse energy will be returned in the reflected pulse. The necessity of operation at such power levels and at high voltages renders more difficult the task of providing adequate frequency variation without loss of efficiency.

It is an object of this invention to provide a method and means for tuning a multi-tube oscillator through a wide range of frequency variation without loss in efficiency.

It is a further object of this invention to provide a multi-tube oscillator capable of operation at high power and voltage levels and capable of being tuned to a wide range of frequency variation without loss of efficiency.

It is another object of this invention to provide a method and means for instantaneously shifting the frequency of a multi-tube oscillator.

It is still another object of the invention to provide means for varying the frequency of a multi-tube oscillator by the manipulation of a single control means.

It is still another object of this invention to provide means for the simultaneous grid and filament tuning of a multi-tube oscillator, so phased that maximum efficiency and frequency range can be realized over a desired range of frequency variation.

Other objects will become apparent from a careful consideration of the following description when taken together with the accompanying drawings in which.

Applicant's oscillator comprises a plurality of ring-mounted oscillator tubes having their plates shorted to a common shorting plate, with their grids serially connected and a filament circuit coupled to an antenna by means of an arrangement of filament frames coupled to a concentric transmission line which is in turn coupled to an output circuit such as an antenna. The disclosure in this application is restricted to an oscillator employing four tubes, but it should be distinctly understood that any even number of tubes from two upwards may be employed.

Figures 1, 2:
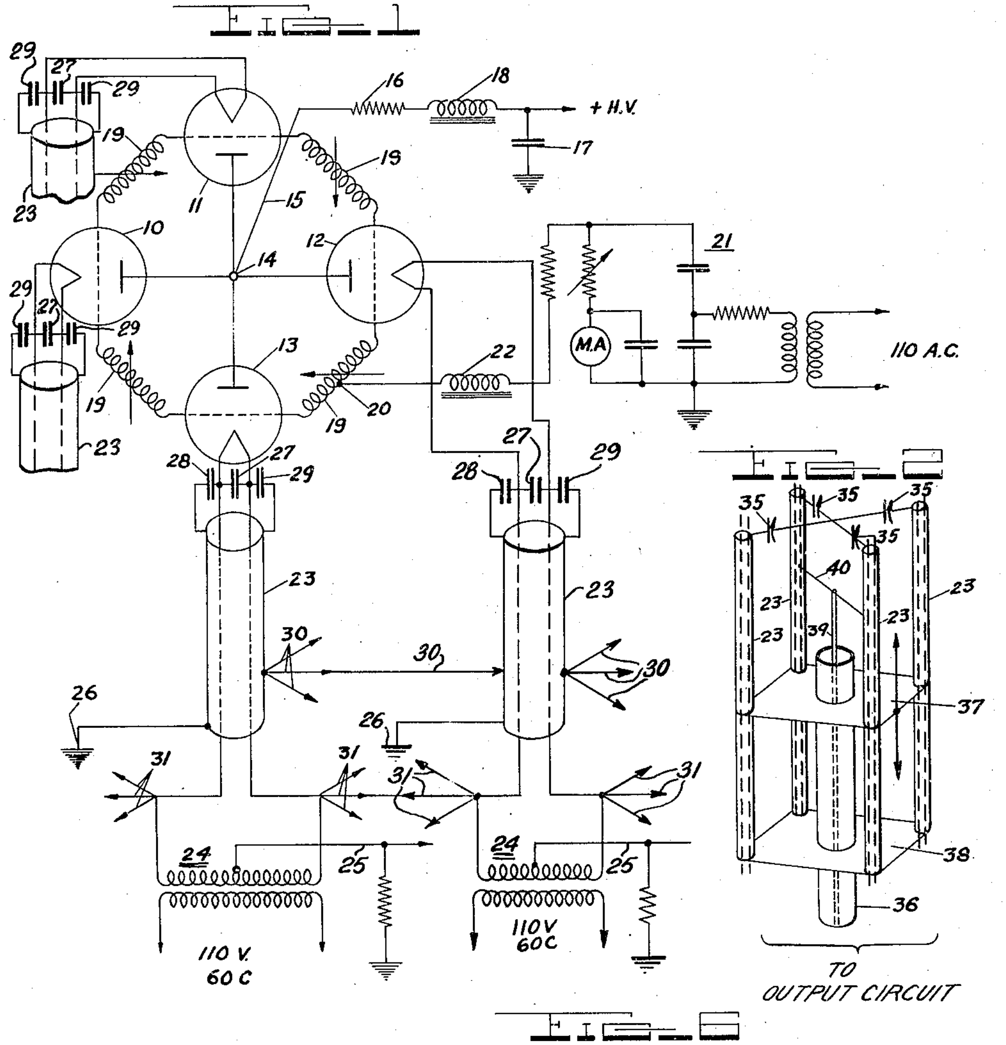
Fig. 1 is a schematic circuit diagram of an oscillator embodying the invention.
Fig. 2 is a schematic circuit diagram of the filament coupling means employed in connection with the invention.

In the schematic circuit diagram of Fig. 1 is shown such an assembly having oscillator tubes 10, 11, 12 and 13 with their plates shorted to a common point 14 to which is attached high voltage lead 15 containing the small non-inductive resistor 16 and a radio frequency choke 18, and being provided with a radio frequency bypass condenser 17. The resistor 16 and the choke 18 are employed either singly or together, when necessary, to prevent the occurrence of spurious oscillations in this lead. The grids of these tubes are connected in series by means of variable inductance coils 19, one being connected between each pair of adjacent tubes. Connected to the mid-point 20 of one of these inductances is the keying circuit 21 which does not form a part of the invention and is therefore not described in detail. This circuit also is shown to contain a radio frequency choke 22 which may be included if necessary to prevent the occurrence of spurious oscillations. The circuit shown is coupled to a 110-volt alternating current source and keys the oscillator at the frequency of the current.

The filament leads of each tube are led downwardly through a hollow filament frame rod 23. As shown in connection with tubes 12 and 13, after emerging from the frame rod each of these leads is short-circuited to the corresponding leads of the other tubes, as indicated by the arrows 31, and each is coupled through a transformer 24 to a source of 110-volt alternating current. A keying indicator pulse lead 25 is shown attached to the mid-point of the secondary of the transformer 24. The filament frame 23 is shown as grounded at 26 and radio frequency bypass capacity is provided between the two filament leads and between each of the filament leads and its filament frame rod as represented by capacitors 27, 28 and 29 respectively. Each of the rods is short-circuited to the others as indicated by the arrows 30. Although the complete filament circuit has been shown only with regard to tubes 12 and 13, it should be understood that identical circuits are provided at each of the remaining tubes.

The mechanical arrangement of the filament frames and concentric transmission line forming the radio frequency filament circuit is shown in Fig. 2. It will be noted that each of the filament frame rods 23 is positioned at the corner of a square and extends parallel to the others. This is the actual physical relationship of these rods in the oscillator. The upper ends of the rods are shown as interconnected by short-circuiting leads each containing a variable condenser 35. The construction and operation of these condensers will be more fully described hereinafter. The outer conductor 36 of the transmission line is shown as short-circuited to the filament frames by means of a short-circuiting plate 37. An end plate 38 is provided at the lower ends of the frames for the purpose of rendering support. It will be noted that the outer conductor 36 extends upwardly for a certain distance above the short-circuiting plate 37. This arrangement allows the short-circuiting plate to be raised or lowered for the purpose of regulating the coupling and is more fully described in the application of Robert M. Page et al., Ser. No. 456,046, filed August 25, 1942, now Patent No. 2,426,236. The inner conductor 39 of the transmission line is extended upwardly above the upper end of the outer conductor and terminates in a coupling bar 40 which connects it to two diagonally opposite filament frames 23. If the number of tubes employed varies, the same coupling principle may be employed by connecting the inner conductor to the alternate filament frame rods; thus, if two tubes only are employed, the inner conductor is coupled to one filament frame rod. If six tubes are employed, it would be coupled to three.

The tuning of an oscillator of this type may be accomplished either by tuning the grid circuit or the filament R. F. circuit. This may be done by tuning the inductance coils 19 or by varying the filament coupling by raising or lowering the shorting plate 37. However, if tuning by means of the grid inductances alone is resorted to, it will be found necessary to simultaneously raise or lower the short-circuiting plate in order to avoid forcing the filament circuit into oscillation with a corresponding loss in efficiency. Similarly, if tuning be attempted by moving the shorting plate alone, it will be found that the operation of the oscillator will be very inefficient at all frequencies except that for which the grid circuit is capable of free oscillation together with the filament circuit.

It can be readily seen, therefore, that in order to secure efficient operation over all portions of a desired frequency range, it is necessary that some means be provided for the simultaneous tuning of both the filament and grid circuits. However, the provision of a means for the simultaneous tuning of the grid circuit and raising or lowering of the shorting plate involves mechanical difficulties which are practically unsolvable without complicated and cumbersome structure. Applicants have therefore devised a means for simultaneously tuning both circuits which is simple and free of mechanical difficulty and adapts itself well to the mechanical arrangement of the oscillators, as well as avoiding the introduction of weak points from the standpoint of sparkover and corona.

Figures 3, 4, 5:
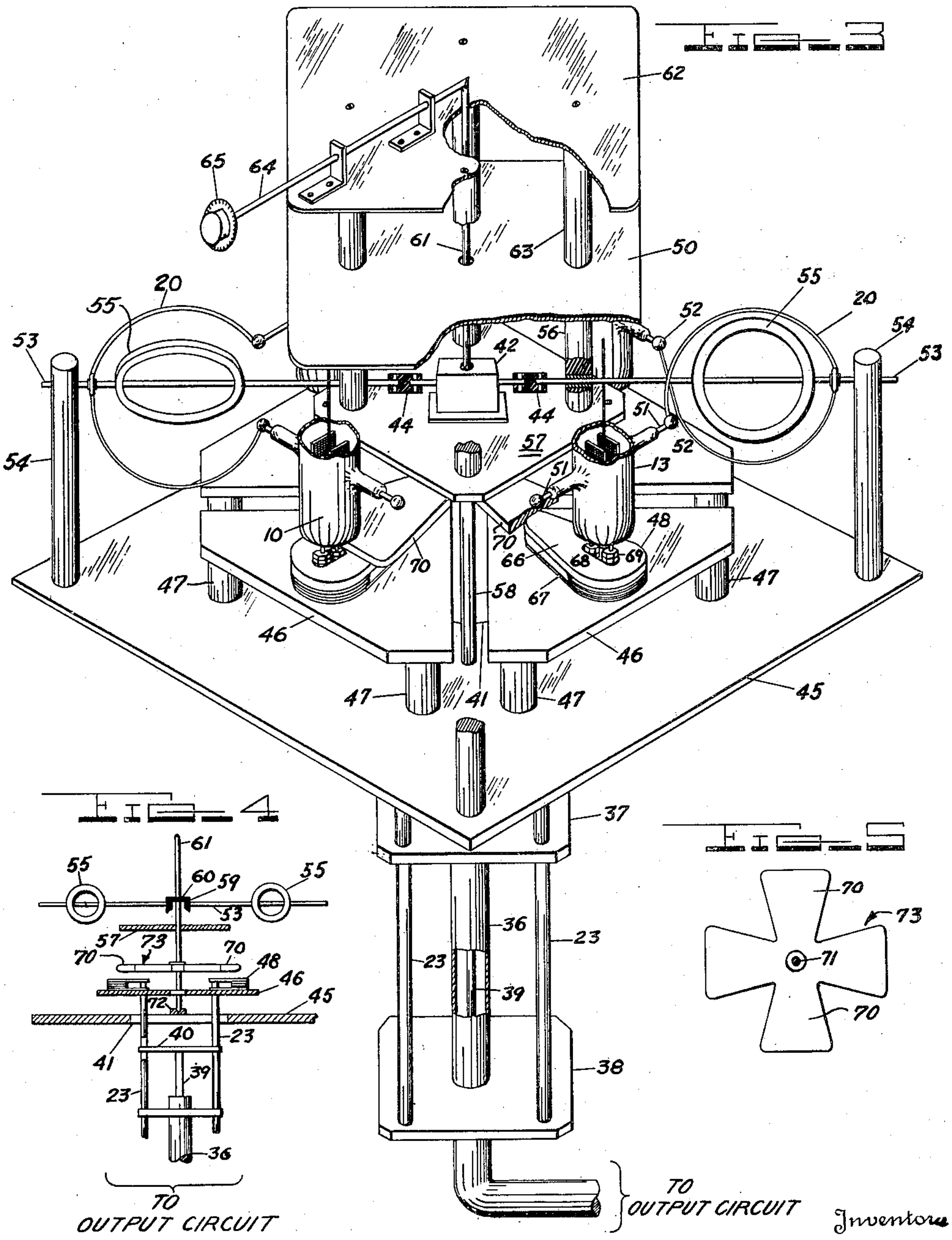
Fig. 3 is a perspective view of an oscillator embodying the invention, portions of the structure being broken away to more clearly show the important structural details.
Fig. 4 is an elevational view of a portion of the oscillator of Fig. 3 showing the arrangement of the ganged grid vane and filament capacitor tuning devices and a portion of the filament coupling means.
Fig. 5 is a plan view of the tuning means for the filament capacitors.

These features of applicant's invention can be more readily seen in Figs. 3, 4 and 5. The oscillator is shown mounted on the base plate 45 on which are mounted four segment-shaped plates 46 of insulating material which provide a support for the tubes. These plates are mounted on insulating stand-offs 47 and each supports a condenser assembly 48 on which is mounted an oscillator tube. The plate terminals of each of the tubes are conductively secured to a shorting plate 50. Each tube is provided with a pair of grid terminals 51 which emerge from opposite sides of the tube. Between each pair of adjacent tubes is positioned a single turn grid-inductance 20 having its ends secured to the grid terminals of adjacent tubes by means of corona balls 52 and its midpoint provided with a bearing for a rod 53 which is supported near its outer end by an insulated post 54. Mounted on the rod within the inductance coil is a tuning vane 55. The rod extends inwardly toward the center of the oscillator assembly finding bearing support in an insulated post 56 which is mounted on a plate of insulation 57 supported in turn above base plate 45 on posts 58 of insulating material. The rod terminates in a crown gear 59 which meshes with a crown gear 60, shown in Figs. 4 and 6, mounted on a vertical shaft 61 extending upwardly through the shorting plate 50 and through a plate 62 supported by posts 63 of insulating material. The plate 62 gives support to a tuning rod 64 terminating in a tuning dial 65. Rotation of the rod 64 rotates rod 61 to vary the position of the tuning vanes 55.

Figure 6:
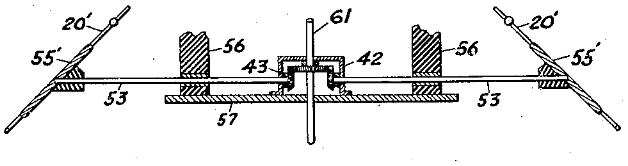
Fig. 6 is an elevational view of a fragment of the oscillator of Fig. 3 showing the use of a modified vane and grid coil arrangement.

Fig. 6 shows an alternative arrangement of tuning vanes and grid coils. In this modification the vanes 55′ are mounted on the shafts 55 at an angle of 45° and the grid coils 20′ are mounted to lie in planes intersecting the vertical axis of the oscillator at an angle of 45°. Fig. 6 shows each vane lying in the plane of its respective coil.

Fig. 6 illustrates the interior of the gear box 42 attached to the upper surface of plate 57 which, by means of bosses 43 attached to its inner surface, furnishes bearing support for the inner ends of the shafts 53 and the shaft 61. The gear box 42 may be omitted in the oscillator as shown in Fig. 3, since posts 54 and 56 furnish adequate support. If it is used with that form of the invention the posts 54 may be dispensed with, if desired.

In both forms of the invention the shafts 53 may be of metal. If necessary an insulating coupling such as shown at 44 in Fig. 3 may be employed in each of the shafts 53. If some such insulating arrangement is not used the shaft 61 must be of insulating material.

The use of each type of vane shown is attended by certain advantages. If the type shown in Fig. 3 be used, different signal vanes and coils for various frequency ranges may be substituted with ease.

Figure 7:
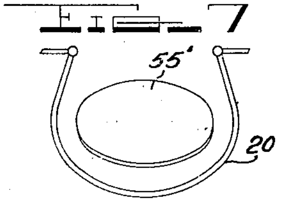
Fig. 7 is an elevational view of one of the vanes of Fig. 6 and its associated grid coil, looking from the left of Fig. 6.

On the other hand, with the use of the type of coil shown in Figs. 6 and 7, coils can be changed without interfering with the vanes on their shafts and, of greater importance, the vane shafts 53 do not pass between the grid corona balls. This latter feature is of importance in the prevention of sparkover since the shaft 53 in the form of Fig. 3 is at high potential with respect to the grid corona balls. With this type of vane the single turn coil may readily be replaced with a coil of two or more turns, if desired.

The condenser assembly 48 provides the three radio frequency bypass capacitances indicated in Fig. 1 between the filament leads of each tube and between each filament lead and the filament frame. This condenser assembly comprises a stack of four condenser plates separated by disks of insulating material, the intermediate plates being circular in shape and the upper and lower plates being elongated as shown at 66 and 67 in Fig. 3. The upper and lower plates are conductively connected together and to the top end of the filament frame as indicated in Fig. 4. The filament frames extend downwardly through an opening 41 formed in the center of base plate 45. The filament terminals of each tube extend downwardly to an opening formed in the top plate 66 and are connected to pin vise connectors shown at 68 and 69 in Fig. 3. These connectors in turn are each connected to a respective one of the intermediate plates of the assembly and are insulated from all other parts of the condenser. A filament lead is connected to each of the intermediate plates and is led into and downwardly through the filament frame rod. A more detailed description of the filament condenser assembly will be found in the application of R. M. Page et al., Ser. No. 456,044, filed August 25, 1942, now Patent No. 2,445,256.

For synchronously varying the tuning of the filament condensers and thus similarly varying the tuning of the filament circuits a fan-shaped butterfly type tuning plate 73 is provided. This plate is shown partially in Fig. 3 being more fully shown in Fig. 5. The plate consists of 4 lobes or tongues 70, each of which is identically positioned with respect to one of the condenser assemblies 48 when the tuning plate is located in place in the oscillator. The plate is provided with the central hole 71 through which extends the shaft 61 mentioned above. This shaft extends downwardly below the tuning plate and terminates at the center of the base plate 45 in an insulated thrust-bearing surface 72. The vertical position of the tuning plate above the condensers 48 is selected to give maximum capacitance variation without danger of sparkover.

It has been found that maximum range and effectiveness will be attained in a 4-tube oscillator by allowing 10° clearance in the minimum capacitance position of the tuning plate 73. With this allowance, since 4 tubes are employed, the angle between the lateral edges of the vanes of the tuning plate will be 40°. The angle between the edges of the filament condenser plates will also be 40°.

The relative positions of the tuning vanes and tuning plate are so synchronized that the vanes lie in the planes of their respective coils when the tuning plate is in its position of minimum effect, or with its lobes midway between adjacent condenser assemblies 48.

With the employment of the filament tuning plate 73 as described above opposite filament frames will be swinging 180° out of phase with each other as the tuning plate is rotated. This condition causes the electrical center of the filament condenser assembly to remain at zero R. F. potential, the condenser tuning plate acting as a voltage divider across the radio frequency circuit at the upper ends of the filament frames. This factor obviates the necessity of tying a ground connection to the center of the condenser assembly, which would be a matter of considerable mechanical difficulty.

While applicants have disclosed a particular embodiment of the invention, numerous variations in construction and arrangement of various details, falling within the scope of the appended claims, will become apparent to those skilled in the art. For example, variations in the point of connection of the gang tuning dial will readily suggest themselves. The dial could for example be attached to a prolongation of one of the rods 53 if desired. Such variations are intended to be comprehended within the scope of the appended claims.

The invention described herein may be manufactured and used by or for the Government of the United States of America for governmental purposes without the payment of any royalties thereon or therefor.

We claim:

1. An oscillator comprising a plurality of oscillator tubes, means mounting said tubes in a ring, means interconnecting the plates of said tubes, a separate inductance coil connecting the control grids of each adjacent pair of said tubes whereby said control grids are serially connected, means coupling the filament of each of said tubes to an output circuit, said coupling means comprising a filament frame rod associated with each of said tubes, a radio frequency bypass means connected between each of said filament frame rods and the filament leads of its respective tube, and gang tuning means for simultaneously varying the inductance of said coils and the resonance of said coupling means.

2. An oscillator comprising a plurality of oscillator tubes, means mounting said tubes in a ring, means interconnecting the plates of said tubes, a separate inductance coil connecting the control grids of each adjacent pair of said tubes whereby said control grids are serially connected, a tuning vane associated with each of said coils for varying the inductance thereof, means coupling the filament of each of said tubes to an output circuit, said coupling means comprising a filament frame rod associated with each of said tubes, a capacitor between each of said filament frame rods and the filament leads of its respective tube, a conductive plate in capacitive relation to said capacitors which relation is variable by movement of said plate for simultaneously varying the resonance of said filament frame rods, and ganged operating means for simultaneously moving said tuning vanes and said movable plate.

3. An oscillator comprising a plurality of oscillator tubes, means mounting said tubes in a ring, means interconnecting the plates of said tubes, a separate inductance coil connecting the control grids of each adjacent pair of said tubes whereby said control grids are serially connected, a tuning vane located within each of said coils, means coupling the filament of each of said tubes to an output circuit, said coupling means comprising a filament frame rod associated with each of said tubes, a capacitor between each of said filament frame rods and the filament leads of its respective tube, a movable conductive plate in variable capacitive relation to said capacitors for simultaneously varying the resonance of said filament frame rods and ganged operating means for simultaneously moving said tuning vanes and said movable plate.

4. An oscillator comprising an even number of oscillator tubes, means mounting said tubes in a ring, means interconnecting the plates of said tubes, a separate inductance coil connecting the control grids of each adjacent pair of said tubes whereby said control grids are serially connected, a radio frequency output circuit comprising a separate filament frame rod associated with each of said tubes, a radio frequency bypass means coupling each of said filaments to its respective filament frame rod at a single coupling point, means conductively connecting each of said filament frames to a common point at said coupling points, and a capacitance in said connecting means being operable to simultaneously vary the tuning of all of said capacitances.

5. Means for varying the frequency of a multi-tube oscillator having the control grids of said tubes serially connected and separated by inductance coils and the plates thereof connected to a common conductor, comprising a separate filament frame rod associated with each of said tubes, means coupling each of said filament frame rods to the filament of its respective tube, and means for simultaneously varying the resonance of said filament frame rods and the inductance of said coils.

6. Means for varying the frequency of a multi-tube oscillator having the control grids of said tubes serially connected and separated by inductance coils and the plates thereof connected to a common conductor, comprising a separate filament frame rod associated with each of said tubes, means coupling each of said filament frame rods to the filament of its respective tube, a tuning vane associated with each of said coils for varying the inductance thereof, a capacitor between each of said filament frame rods and the filament leads of its respective tube, a conductive plate in capacitive relation to said capacitors, which relation is variable by movement of said plate for synchronously varying the resonance of said filament frame rods, and ganged operating means for simultaneously moving said tuning vanes and said movable plate.

7. Means for varying the frequency of a multi-tube oscillator having the control grids of said tubes serially connected and separated by inductance coils and the plates thereof connected to a common conductor, comprising a separate filament frame rod associated with each of said tubes, means coupling each of said filament frame rods to the filament of its respective tube, a tuning vane associated with each of said coils for varying the inductance thereof, a capacitor between each of said filament frame rods and the filament leads of its respective tube, said capacitors being arranged with a corresponding plate of each lying in the same plane, a conductive tuning plate arranged to lie in a plane parallel thereto, said tuning plate being formed with a plurality of lobes equal in number to said capacitors and each bearing an identical positional relationship to a respective one of said capacitors and ganged means for simultaneously moving said tuning vanes and rotating said tuning plate about its axis.

8. Means for varying the frequency of a multi-tube oscillator having the control grids of said tubes serially connected and separated by inductance coils and the plates thereof connected to a common conductor, comprising a separate filament frame rod associated with each of said tubes, means coupling each of said filament frame rods to the filament of its respective tube, a tuning vane associated with each of said coils for varying the inductance thereof, a capacitor between each of said filament frame rods and the filament leads of its respective tube, said capacitors being positioned in a circle concentric with the axis of said oscillator and arranged with a corresponding plate of each occupying the same plane, a conductive tuning plate arranged to lie in a plane parallel thereto, said plate being concentric with said circle of capacitors, said tuning plate being formed with a plurality of tuning lobes equal in number to said capacitors and each bearing an identical positional relationship to a respective one of said capacitors and ganged means for simultaneously moving said tuning vanes and rotating said plate about its center.

9. An oscillator comprising an even number of oscillator tubes, means mounting said tubes in a ring, means interconnecting the plates of said tubes, a separate single turn inductance coil connecting the control grids of each adjacent pair of said tubes whereby said grids are serially connected, a plurality of shafts, each of said shafts extending radially of the axis of said ring and intersecting one of said coils, a tuning vane mounted on each of said shafts and identically positioned within the coil intersected by its respective shaft, means coupling the filament of each of said tubes to an output circuit, and means synchronously rotating said shafts and simultaneously and synchronously varying the impedance of said coupling means to shift the frequency of said oscillator.

10. An oscillator comprising an even number of oscillator tubes, means mounting said tubes in a ring, means interconnecting the plates of said tubes, a separate single turn inductance coil connecting the control grids of each adjacent pair of said tubes whereby said grids are serially connected, a plurality of shafts, each of said shafts extending radially of the axis of said ring and intersecting one of said coils, a tuning vane mounted on each of said shafts and identically positioned within the coil intersected by its respective shaft, means coupling the filaments of each of said tubes to an output circuit, said coupling means comprising a filament frame rod associated with each of said tubes, a radio frequency bypass means connected between each of said filament frame rods and the filament leads of its respective tube and means for synchronously rotating said shaft and simultaneously and synchronously varying the tuning of said filament frame rods.

11. An oscillator comprising an even number of oscillator tubes, means mounting said tubes in a ring, means interconnecting the plates of said tubes, a separate single turn inductance coil connecting the control grids of each adjacent pair of said tubes whereby said grids are serially connected, a plurality of shafts, each of said shafts extending radially of the axis of said ring and intersecting one of said coils, a tuning vane mounted on each of said shafts and identically positioned within the coil intersected by its respective shaft, means coupling the filaments of each of said tubes to an output circuit, said coupling means comprising a filament frame rod associated with each of said tubes, a capacitor between each of said filament frame rods and the filament leads of its respective tube, a conductive plate in a capacitive relation to said capacitors, which relation is variable by movement of said plate for synchronously varying the impedance of said filament frame rods, and means synchronously rotating said shafts and moving said plate.

12. An oscillator comprising an even number of oscillator tubes, means mounting said tubes in a ring, means interconnecting the plates of said tubes, a separate single turn inductance coil connecting the control grids of each adjacent pair of said tubes whereby said grids are serially connected, a plurality of shafts, each of said shafts extending radially of the axis of said ring and intersecting one of said coils, a tuning vane mounted on each of said shafts and identically positioned within the coil intersected by its respective shaft, means coupling the filament of each of said tubes to an output circuit, said coupling means comprising a filament frame rod associated with each of said tubes, a capacitor between each of said filament frame rods and the filament leads of its respective tube, said capacitors being arranged with a corresponding plate of each lying in the same plane, a conductive tuning plate arranged to lie in a plane parallel thereto, said tuning plate being formed with a plurality of lobes equal in number to said capacitors and each bearing an identical positional relationship to a respective one of said capacitors and means synchronously rotating said shafts and simultaneously rotating said tuning plate about its axis.

13. Means for varying the frequency of a multi-tube oscillator having the control grids of said tubes serially connected and separated by inductance coils and the plates thereof connected to a common conductor, comprising a multi-conductor resonant circuit having a separate conductor for each of said tubes, means coupling said circuit to the filaments of said tubes, and means for simultaneously varying the inductance of said coils and the resonance of said circuit.

14. An oscillator comprising a plurality of tubes mounted in a ring, means interconnecting the plates of said tubes, means serially connecting the grids of said tubes in a continuous circuit, a variable reactance means forming a part of said continuous circuit between each adjacent pair of said grids, a multi-conductor resonant circuit having a separate conductor for each of said tubes, means coupling said resonant circuit to the filaments of said tubes, and means simultaneously varying said reactance means and the resonance of said resonant circuit.

ROBERT M. PAGE.
MERRIL F. DISTAD.
LAMONT V. BLAKE.

REFERENCES CITED

The following references are of record in the file of this patent:

UNITED STATES PATENTS

| Number | Name | Date |
|---|---|---|
| 1,934,523 | Brown | Nov. 7, 1933 |
| 2,067,679 | Paddle | Jan. 12, 1937 |
| 2,081,425 | Fay | May 25, 1937 |
| 2,252,370 | Goldstine | Aug. 12, 1941 |
| 2,253,849 | Dow | Aug. 26, 1941 |
| 2,272,599 | Clavier | Feb. 10, 1942 |
| 2,298,075 | Tinus | Oct. 6, 1942 |

FOREIGN PATENTS

| Number | Country | Date |
|---|---|---|
| 488,508 | Great Britain | July 8, 1938 |